(12) United States Patent
Huang et al.

(10) Patent No.: US 7,420,393 B2
(45) Date of Patent: Sep. 2, 2008

(54) SINGLE GATE OXIDE LEVEL SHIFTER

(75) Inventors: Sheng-Tsai Huang, Hsin-chu (TW); Wen-Tai Wang, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 53 days.

(21) Appl. No.: 11/483,319

(22) Filed: Jul. 7, 2006

(65) Prior Publication Data

US 2008/0007301 A1   Jan. 10, 2008

(51) Int. Cl.
*H03K 19/0175* (2006.01)
(52) U.S. Cl. .......................................... 326/68; 326/81
(58) Field of Classification Search .................. 326/68, 326/62, 63, 80–87; 327/333
See application file for complete search history.

(56) References Cited

U.S. PATENT DOCUMENTS

| | | | | |
|---|---|---|---|---|
| 4,888,498 A * | 12/1989 | Kadakia | ..................... | 327/546 |
| 5,729,156 A * | 3/1998 | Lim | ............................. | 326/73 |
| 5,825,205 A * | 10/1998 | Ohtsuka | ....................... | 326/81 |
| 5,969,542 A | 10/1999 | Maley et al. | ................... | 326/81 |
| 6,031,394 A | 2/2000 | Cranford, Jr. et al. | ......... | 326/81 |
| 6,201,428 B1 | 3/2001 | Clark | .......................... | 327/333 |
| 7,151,391 B2 * | 12/2006 | Chen et al. | ..................... | 326/68 |

* cited by examiner

*Primary Examiner*—Rexford Barnie
*Assistant Examiner*—Thienvu V Tran
(74) *Attorney, Agent, or Firm*—K & L Gates LLP

(57) ABSTRACT

A level shifter includes a first inverter coupled between the second voltage and the first voltage, and a second inverter coupled between the second voltage and the first voltage, the second inverter being cross-coupled with the first inverter for latching a value therein. A first switch module is coupled between a first data storage node of the first and second inverters and an input signal swinging between the first voltage and a ground voltage. A second switch module is coupled between a second data storage node of the first and second inverters and an inverted input signal swinging between the ground voltage and the first voltage. The first and second inverters and the first and second switch modules include one or more MOS transistors with gate oxide layers of the same thickness.

18 Claims, 6 Drawing Sheets

SINGLE GATE OXIDE LEVEL SHIFTER

BACKGROUND

The present invention relates generally to integrated circuit (IC) designs, and more particularly to a level shifter that contains single gate oxide metal-oxide-semiconductor (MOS) devices.

As technology advances, the electronic devices tend to be smaller, and their operating voltage tends to be lower. For example, devices made by the 0.18μ processing technology usually operate at 1.8V, and those made by the 0.13μ processing technology often operate 1.3V. These low voltage devices are often built in a circuit system that includes other electronic components operating at a higher voltage level, such as 3.3V. In order for signals to travel between the circuits of various operating voltages, a level shifter is needed to up-shift the signals from a low voltage circuit to a high voltage circuit, or to down-shift the signals from a high voltage circuit to a low voltage circuit.

Conventionally, the level shifter includes both thin gate oxide MOS devices and thick gate oxide MOS devices. The thin gate oxide MOS devices have the same gate oxide thickness as that of the MOS devices in the low voltage circuit. The thick gate oxide MOS devices have the same gate oxide thickness as that of the MOS devices in the high voltage circuit. The thin gate oxide devices interface with the low voltage circuit and outputs signals to control the thick gate oxide MOS devices to generate signals that have the same voltage swing as that for the high voltage circuit. Conventionally, the thick gate oxide MOS devices are necessary to prevent the gate oxide breakdown caused by the high operating voltage.

One drawback of the conventional level shifter is that the switching speed of the thick gate oxide devices is slow, thereby degrading its overall performance. Another drawback of conventional level shifter is that the combination of the thin gate oxide MOS devices and the thick gate oxide MOS devices complicates the manufacturing process, thereby increasing the manufacturing costs.

As such, it is desirable to have a level shifter that contains single gate oxide MOS devices, without using the thick gate oxide devices.

SUMMARY

The present invention discloses a level shifter for interfacing a first circuit operating at a first voltage with a second circuit operating at a second voltage higher than the first voltage. In one embodiment of the invention, the level shifter includes a first inverter coupled between the second voltage and the first voltage, and a second inverter coupled between the second voltage and the first voltage, the second inverter being cross-coupled with the first inverter for latching a value therein. A first switch module is coupled between a first data storage node of the first and second inverters and an input signal swinging between the first voltage and a ground voltage. A second switch module is coupled between a second data storage node of the first and second inverters and an inverted input signal swinging between the ground voltage and the first voltage. The first and second inverters and the first and second switch modules include one or more MOS transistors with gate oxide layers of the same thickness.

The construction and method of operation of the invention, however, together with additional objects and advantages thereof will be best understood from the following description of specific embodiments when read in connection with the accompanying drawings.

DESCRIPTION

Figure 1:
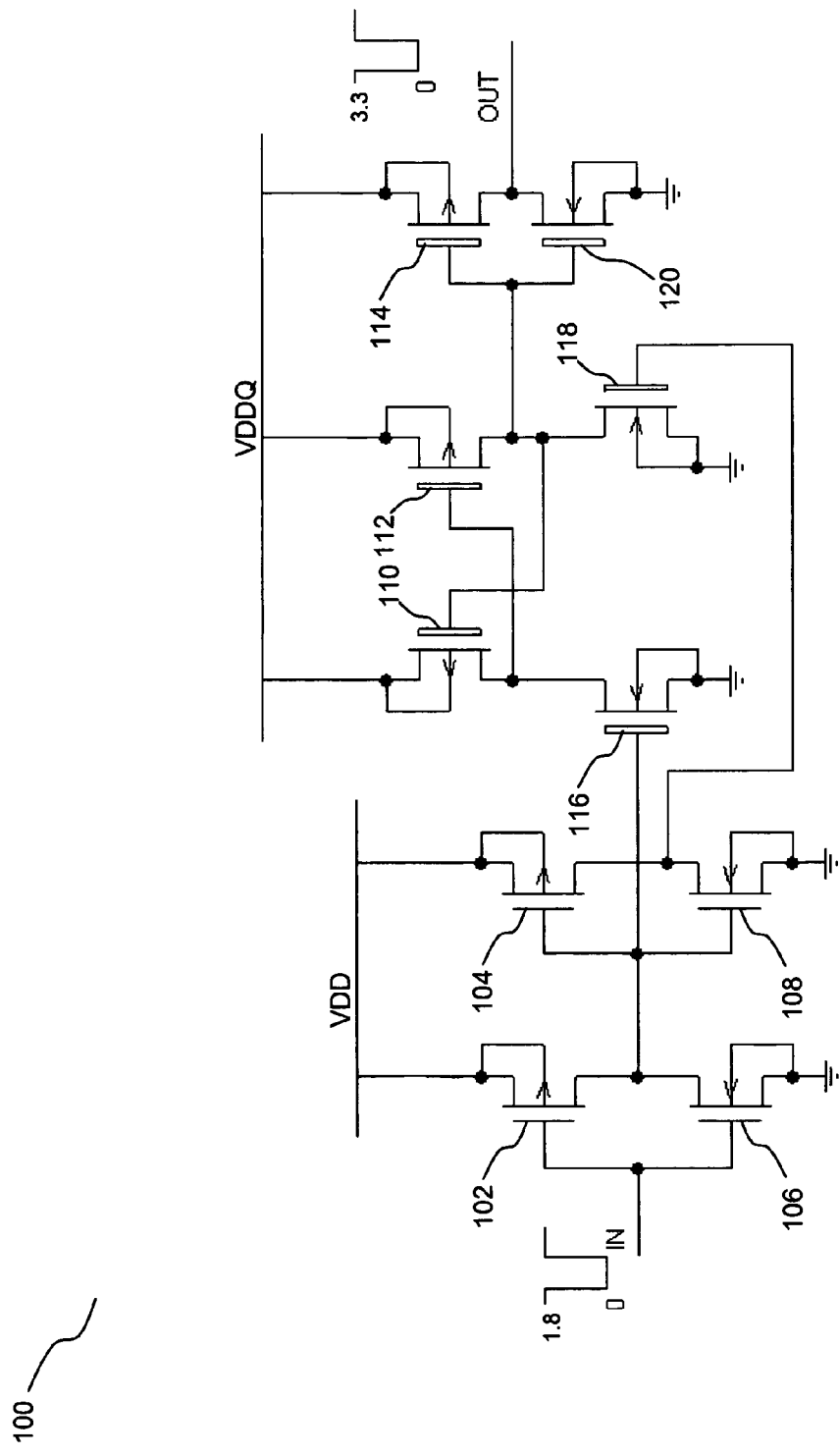
FIG. 1 schematically illustrates a conventional level shifter.

FIG. 1 illustrates a circuit diagram of a conventional level shifter 100 for interfacing a low voltage circuit with a high voltage circuit. PMOS transistors 102 and 104 and NMOS transistors 106 and 108 are coupled between a first operating voltage VDD and ground. PMOS transistors 110, 112, and 114 and NMOS transistors 116, 118, and 120 are coupled between a second operating voltage VDDH, which is higher than the first operating voltage VDD, and ground. While the MOS transistors 102, 104, 106 and 108 are comprised of thin gate oxide layers, the MOS transistors 110, 112, 114, 118 and 120 are comprised of thick gate oxide layers in order to sustain the higher operating voltage VDDQ. The level shifter 100 receives an input signal swinging between 0V and VDD, and generates an output signal swinging between 0V and VDDQ.

One drawback of the conventional level shifter 100 is that the thick gate oxide MOS transistors have a slow switching speed. Another drawback of the conventional level shifter 100 is that the combination of the thin gate oxide MOS transistors and the thick gate oxide MOS transistors complicates its manufacturing processes, and therefore increasing its manufacturing costs.

Figure 2:
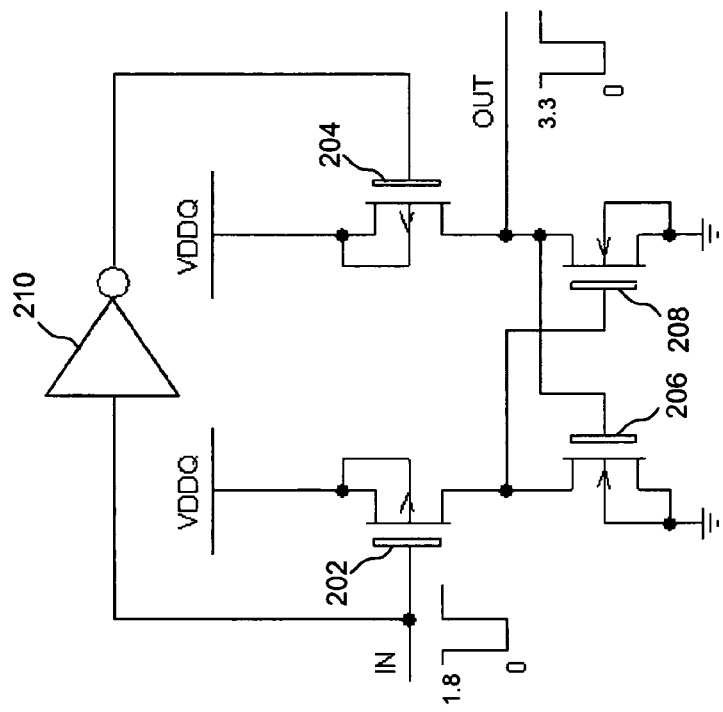
FIG. 2 schematically illustrates another conventional level shifter.

FIG. 2 illustrates a circuit diagram of another conventional level shifter 200, which receives an input signal swinging between VDD and 0V and generates an output signal swinging between VDDQ, which is higher than VDD, and 0V. The level shifter 200 includes PMOS transistors 202 and 204, NMOS transistors 206 and 208, and an inverter 210. The PMOS transistor 202 and the NMOS transistor 206 are serially coupled between VDDQ and ground. The PMOS transistor 204 and the NMOS transistor 208 are serially coupled between VDDQ and ground. The MOS transistors 202, 204, 206 and 208 are comprised of thick gate oxide layers in order to sustain the high operating voltage VDDQ.

One drawback of the conventional level shifter 200 is that the thick-gate-oxide MOS transistors have a slow switching speed. Thus, it is desired to have a level shifter that contains signal gate oxide MOS transistors comprised of thin gate oxide layers instead of thick gate oxide layers.

Figure 3:
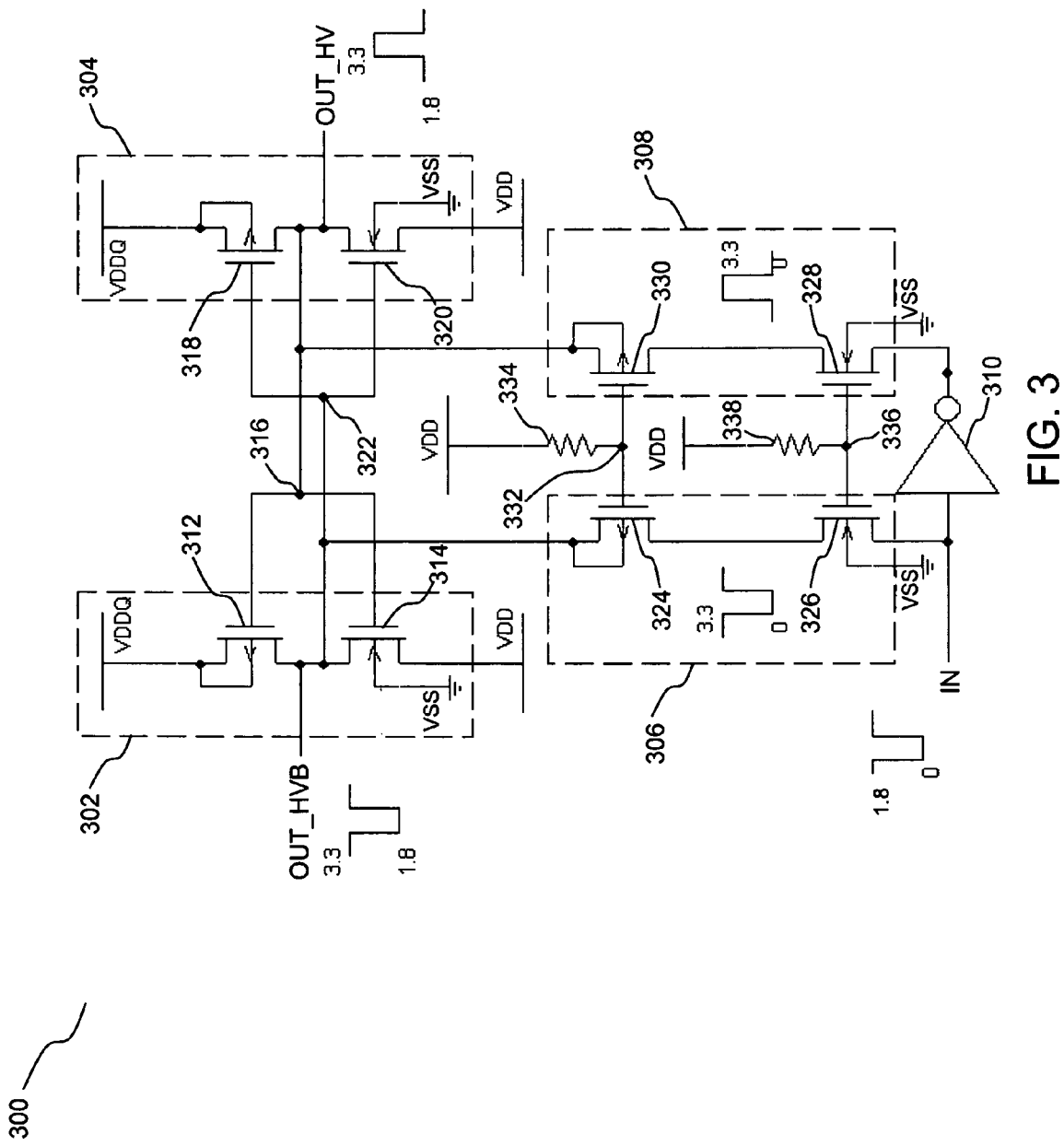
FIG. 3 schematically illustrates a single gate oxide level shifter in accordance to one embodiment of the present invention.

FIG. 3 illustrates a circuit diagram of a single gate oxide level shifter 300 that interfaces a low voltage circuit with a high voltage circuit in accordance with one embodiment of the present invention. The single gate oxide level shifter 300 includes two cross-coupled inverters 302 and 304, two switches 306 and 308, and an inverter 310. The inverter 302 includes a PMOS "pull-up" transistor 312 and an NMOS "pull-down" transistor 314. The source of the PMOS transistor 312 is connected to a "high" operating voltage VDDQ, such as 3.3V. The drain of the PMOS transistor 312 is connected in series with the drain of the NMOS transistor 314. The source of the NMOS transistor 314 is coupled to a "low" operating voltage VDD, which is, for example, 1.8V for electronic devices made by 0.18μ processing technology. The gate of the PMOS transistor 312 is connected together with the gate of the NMOS transistor 314 at a node 316.

The construction of the inverter 304 is similar to that of the inverter 302. The inverter 304 includes a PMOS "pull-up" transistor 318 and an NMOS "pull-down" transistor 320. The source of the PMOS transistor 318 is connected to VDDQ. The drain of the PMOS transistor 318 is connected in series with the drain of the NMOS transistor 320. The source of the NMOS transistor 320 is coupled to VDD. The gates of the PMOS transistor 318 and the NMOS transistor 320 are coupled together at a node 322. The inverters 302 and 304 are cross coupled by connecting the gates of the PMOS transistor 312 and the NMOS transistor 314 to the drains of the PMOS transistor 318 and the NMOS transistor 320 at the node 316 that outputs an inverted output signal OUT_HV, and by connecting the gates of the PMOS transistor 318 and the NMOS transistor 320 to the drains of the PMOS transistor 312 and the NMOS transistor 314 at the node 322 that generates an output signal OUT_HVB. The p-type substrate of the NMOS transistors 314 and 320 are tied to a ground level voltage VSS, which is typically 0V. The n-type substrate of the PMOS transistors 312 and 318 are tied to VDDQ.

The switch 306 includes a PMOS transistor 324 and an NMOS transistor 326. The source of the PMOS transistor 324 is connected to the node 322, which is the input terminal of the cross-coupled inverter 304 as well as the output terminal of the cross-coupled inverter 302. The drain of the PMOS transistor 324 and the drain of the NMOS transistor 326 are connected together in series. Similarly, the switch 308 also includes an NMOS transistor 328 and a PMOS transistor 330 that are also connected together in series. The source of the PMOS transistor 330 is connected to the node 316, which is the input terminal of the cross-coupled inverter 302 and the output terminal of the cross-coupled inverter 304. More particularly, the gate of the PMOS transistor 324 and the gate of the PMOS transistor 330 are connected together at a node 332, which is further connected to VDD through a resistor 334. The gate of the NMOS transistor 326 and the gate of the NMOS transistor 328 are connected together to a node 336, which is further connected to VDD through a resistor 338. The source of the NMOS transistor 326 is connected to an input terminal of the inverter 310, which has an output terminal further connected to the source of the NMOS transistor 328.

In operation, an input signal IN swinging between VDD and 0V is received at the source of the NMOS transistor 326. The voltage between the drains of the PMOS transistor 324 and the NMOS transistors 326 will swing from VDDQ to VSS when the input signal IN swings from VDD to VSS. Simultaneously, this high to low transition at the input terminal of the input inverter 310 will be inverted as from low to high at the output terminal of the inverter 310. The voltage between the drains of the PMOS transistor 330 and the NMOS transistor 328 will follow the output of the inverter 310 from VSS to VDDQ. As a result, the input signal IN at the input terminal of the inverter 310 makes a transition from VDD to 0V with the initial state VDD and will quickly pass the VSS voltage level through the NMOS transistor 328 and the PMOS transistor 330 and pull down the inverted output signal OUT_HV to VDD. The cross-coupled structure of inverters 302 and 304 ensures logically opposite voltages are maintained at the node 316 and 322 respectively, so the cross-coupled inverters latch the lower voltage level VDD at the node 316 and the higher voltage level VDDQ at the node 322. The PMOS transistor 324 therefore turns on to pull the voltage between the drains of the PMOS transistor 324 and the NMOS transistor 326 to the high voltage level VDDQ. This allows the NMOS transistor 326 to be in a turn on state until the voltage between the drains of the PMOS transistor 324 and the NMOS transistor 326 is over one voltage threshold (Vtn) below VDD.

When the high to low transition is at the input terminal of the input inverter 310, it will be inverted from low to high at the output terminal of the inverter 310. The NMOS transistor 326 will be turned on and discharge the voltage between the drains of the PMOS transistor 324 and the NMOS transistor 326 to the low voltage level VSS, so as to pull down the voltage level of the node 322 to VDD. Since the cross-coupled inverters 302 and 304 ensures that logically opposite voltages are respectively maintained at the nodes 322 and 316, the cross-coupled inverters latch VDD at the node 322 and VDDQ at the node 316. The PMOS transistor 330 therefore turns on to pull up the voltage between the drains of the PMOS transistor 330 and the NMOS transistor 328 to VDDQ. This allows the NMOS transistor 328 to be turned off when the voltage between the drains of the PMOS transistor 330 and the NMOS transistor 328 is over one voltage threshold (Vtn) below VDD.

Furthermore, if the initial condition of the input terminal of the inverter 310 has a transition from 0V to VDD with 0V as the initial state, the PMOS transistor 324 will be turned off initially, and the node 322 is pulled down to VDD. The cross-couple inverters 302 and 304, in turn, latch VDDQ at the node 316. The PMOS transistor 330 therefore turns on initially to pull the voltage between the drains of the PMOS transistor 330 and the NMOS transistor 328 to VDDQ. If the high to low transition is at the input terminal of the input inverter 310, its output terminal will go from low to high. The NMOS transistor 328 will be turned on to discharge the voltage between the drains of the PMOS transistor 330 and the NMOS transistor 328 to VSS, and to pull down the voltage level of the node 316 from VDDQ to VDD. The cross-coupled inverters 302 and 304 ensure that logically opposite voltages are maintained at the nodes 322 and 316 respectively. Thus, the cross-coupled inverters latch VDD at the node 316 and VDDQ at the node 322. The PMOS transistor 324 therefore turns on to pull up the voltage between the drains of the PMOS transistor 324 and the NMOS transistor 326 to the higher voltage level VDDQ. The NMOS transistor 328 will be turned off when the voltage between the drains of the PMOS transistor 324 and the NMOS transistor 326 is over one voltage threshold (Vtn) below VDD.

The p-type substrate of the NMOS transistors 326 and 328 are tied to the ground level voltage VSS. The n-type substrate of the PMOS transistor 324 is coupled to the source terminal of the PMOS transistor 324, and the substrate of the PMOS transistor 330 is also connected to its source terminal. The source of the NMOS transistor 326 is connected to the input of the inverter 310 while its output is connected to the source of the NMOS transistor 328. The inverter 310 is a conventional CMOS inverter and is comprised of a PMOS transistor and an NMOS transistor whose gates are coupled together to define an input terminal and whose drains are also coupled together to define an output terminal. The source of the conventional inverter's PMOS device is connected to VDD. The p-type substrate of the inverter's NMOS transistors is connected to VSS.

This single gate oxide level shifter 300 is used to convert logic signals from a core circuit having an operating voltage swinging between 0V and VDD, such as 1.8V, to an I/O output terminal with higher voltage levels from VDDQ, such as 3.3V, to 0V. If an input signal IN at the input terminal switches from VDD to zero voltage, the output signal OUT_HV at the node 316 will follow to switch from VDDQ to VDD and the non-inverted output node 322 will be switched from VDD to VDDQ. The switches 306 and 308 play an important role in the signal transition from VDDQ to VDD, and vice versa.

It is understood that there are issues of gate oxide breakdowns when a low voltage device is connected to a high operating voltage and the voltage difference at the gate oxide is above the breakdown voltage. In this invention, the low voltage device can be exposed to VDDQ, while keeping the voltage across its gate oxide below the breakdown voltage. By connecting the cross-coupled inverters 302 and 304 between VDDQ and VDD, the voltage difference across the gate oxides of MOS transistors therein can be maintained below the breakdown voltage. Since the gates of the PMOS transistors 324 and 330 are tied to the high level voltage VDD, the voltage difference between the gate and the source or drain will be less than the breakdown voltage. Similarly, by tying the gates of NMOS transistors 326 and 328 to VDD and connecting the NMOS transistors 314 and 320 to VDD, the voltage difference between the gate and the source or drain will be limited. Thus, all the NMOS transistors implemented in the level shifter 300 can be thin gate oxide devices. It is noted that the thin gate oxide is preferably no more than 40 Å in thickness.

One advantage of the proposed single gate oxide level shifter is that its manufacturing costs are much lower than the traditional dual gate oxide level shifter. Another advantage of the proposed level shifter is that its switching speed can be improved because no thick gate oxide device is used.

Figure 4A:
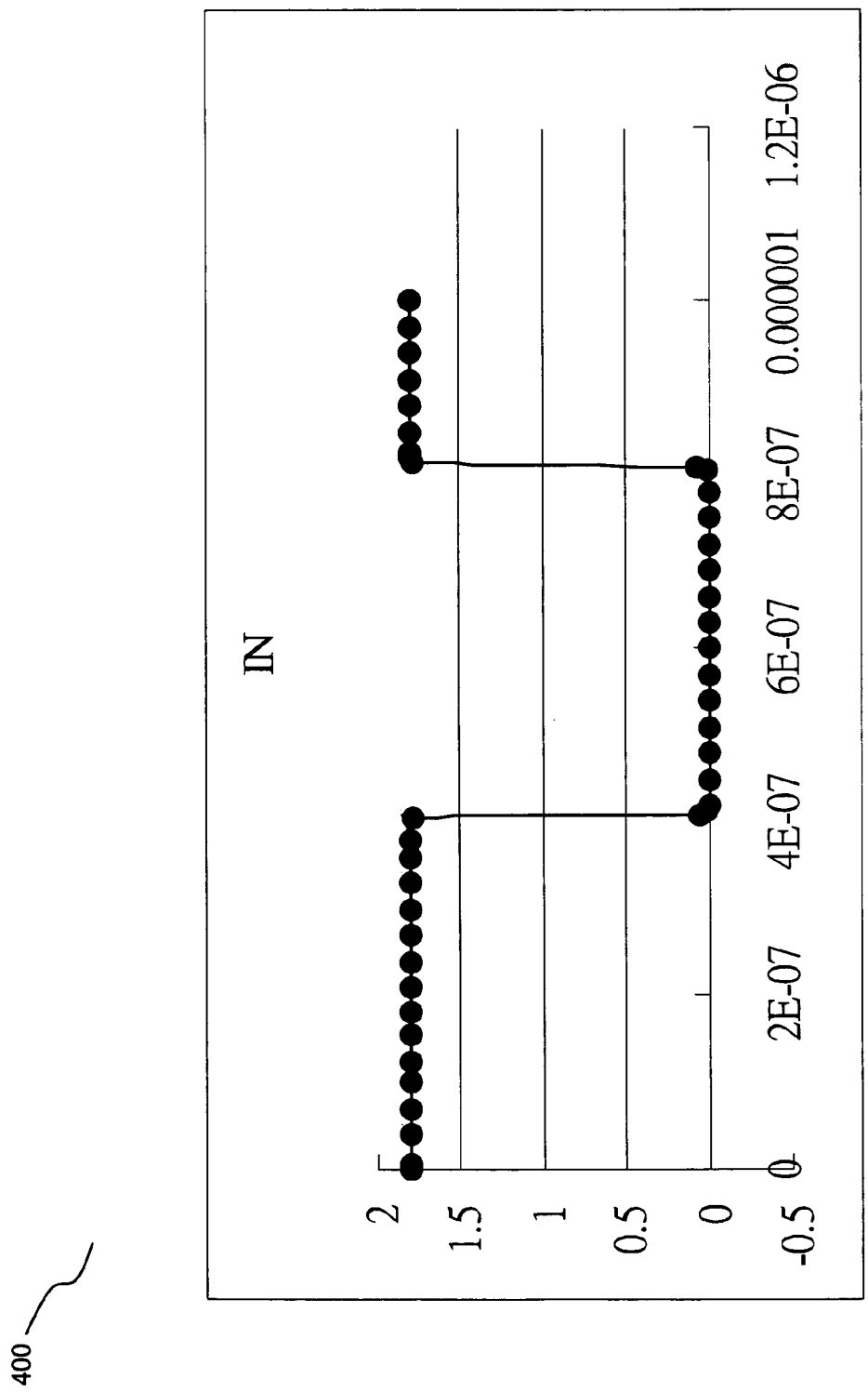
FIG. 4A shows an exemplary input signal for the signal gate oxide level shifter of FIG. 3.

FIG. 4A illustrates a graph 400 showing an exemplary input signal IN that may be inputted into the single gate oxide level shifter 300. The input signal IN is designed to swing between VSS and VDD. The exemplary input signal IN is set high to 1.8 volts initially. The input signal IN is lowered to 0 volt at 400 ns and raised back to 1.8 volt at 800 ns.

Figure 4B:
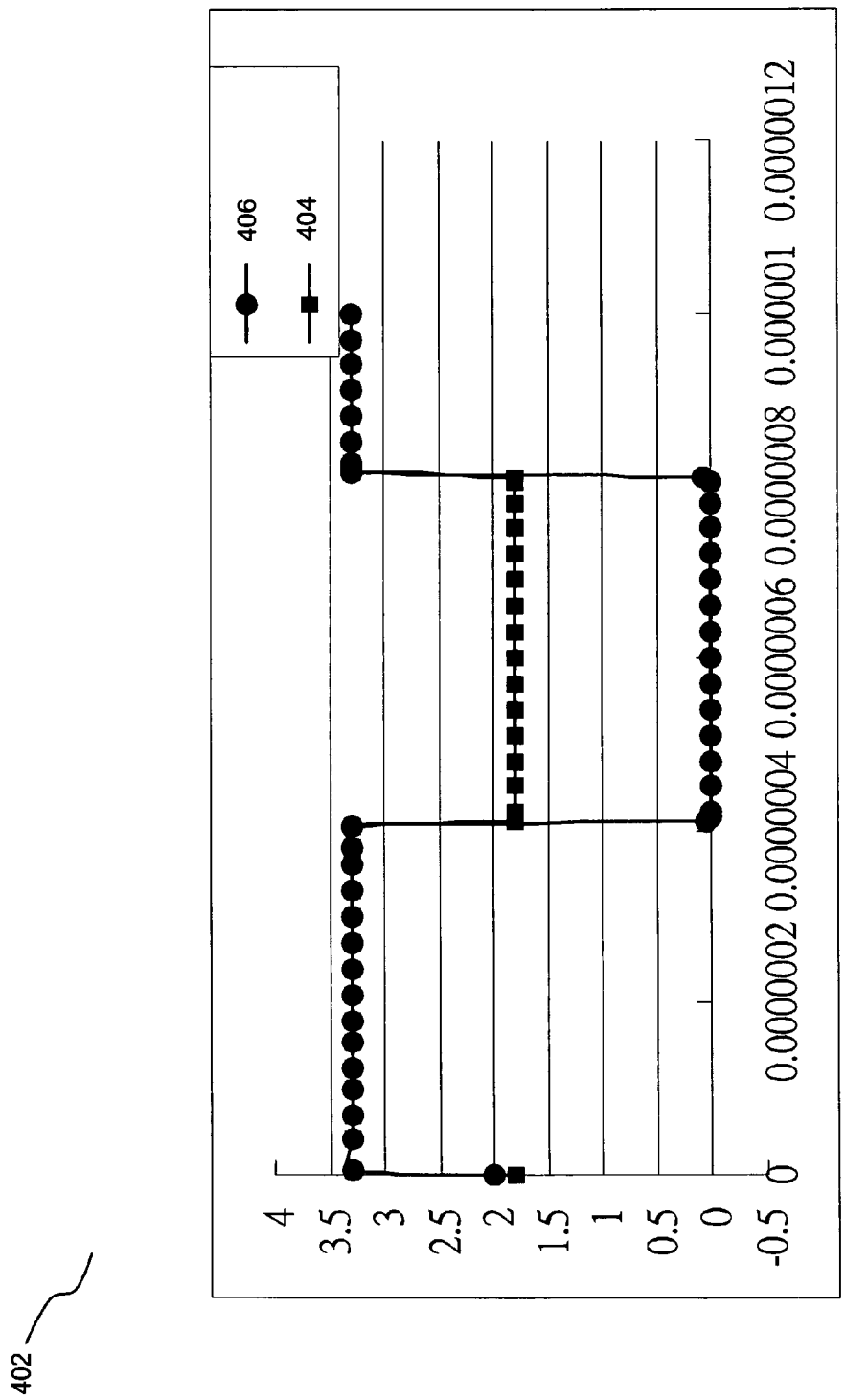
FIG. 4B shows an exemplary inverted output signal generated by the single gate oxide level shifter of FIG. 3.

FIG. 4B illustrates a graph 402 showing the inverted output signal OUT_HVB provided by the single gate oxide level shifter 300 when the input signal IN from FIG. 4A is used as an input. In the graph 402, two signals are provided: a signal 404 is used to represent the inverted output signal OUT_HVB while another signal 406 is used to represent the voltage signal between the drains of the PMOS transistor 324 and the NMOS transistor 326 in FIG. 3. The signal 404 is designed to swing between VDD and VDDQ while the signal 406 is designed to swing between VSS and VDDQ. As the signal 406 which represents the voltage between the drains of the PMOS transistor 324 and the NMOS transistor 326 changes from VDDQ to VSS at 400 ns, the signal 404 which represents the inverted output signal OUT_HVB also drops from VDDQ to VDD. At 800 ns, both signals 404 and 406 are switched back to VDDQ.

Figure 4C:
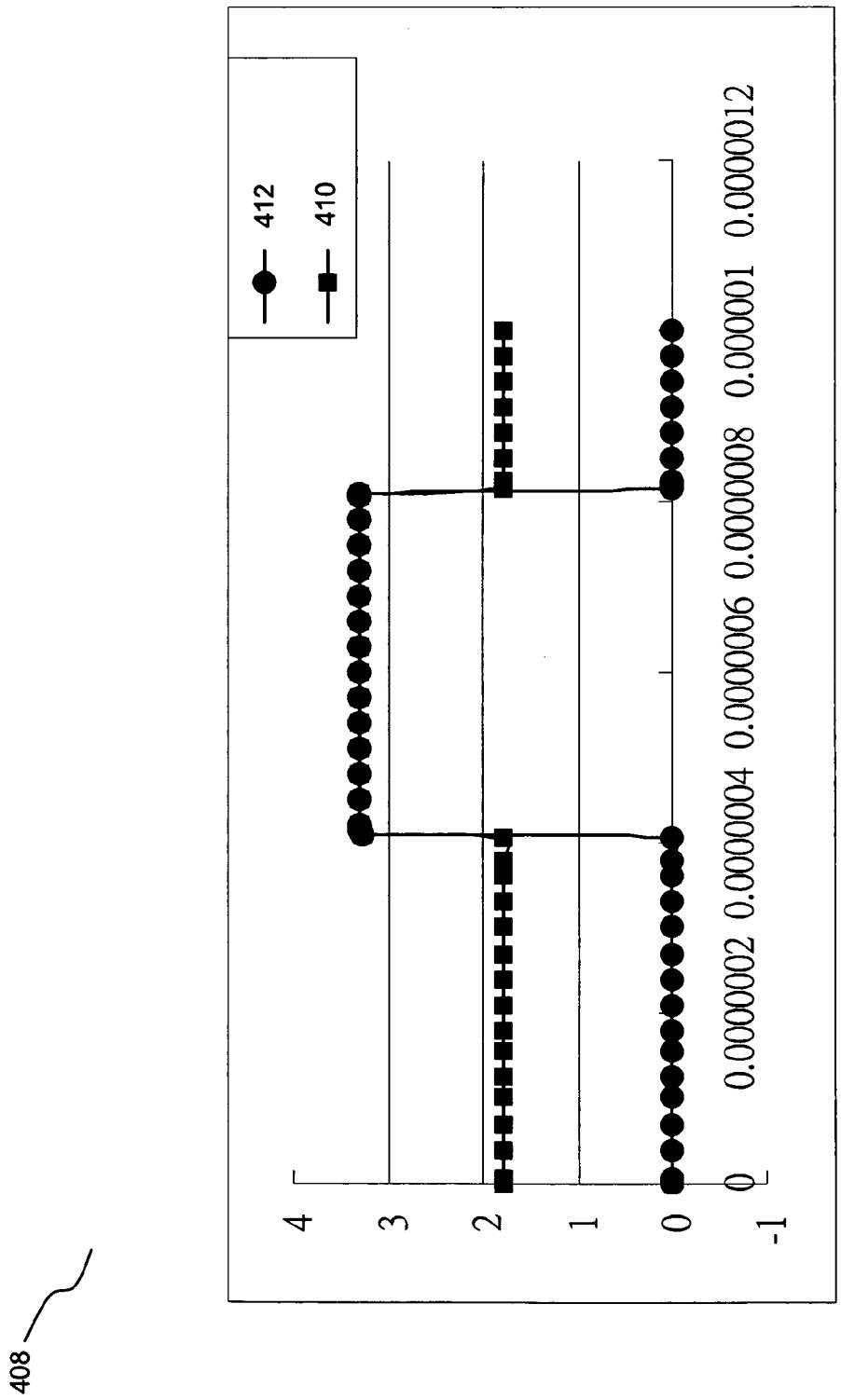
FIG. 4C shows an exemplary output signal provided by the single gate oxide level shifter of FIG. 3.

FIG. 4C illustrates a graph 408 showing the output signal provided by the single gate oxide level shifter 300 when the input signal IN from FIG. 4A is used as an input. In the graph 404, two signals are provided: a signal 410 is used to represent the output signal OUT_HV while another signal 412 is used to represent the voltage signal between the drains of the PMOS transistor 330 and the NMOS transistor 328 in FIG. 3. The signal 410 is designed to swing between VDD and VDDQ, while the signal 412 is designed to swing between VSS and VDDQ. As the signal 412 which represents the voltage between the drains of the PMOS transistor 324 and the NMOS transistor 326 changes from VSS to VDDQ at 400 ns, the signal 410 which represents the output signal OUT_HV also raises from VDD to VDDQ. At 800 ns, both signals 410 and 412 are switched back to VDD and VSS, respectively.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A level shifter for interfacing a first circuit operating at a first voltage higher than a ground voltage with a second circuit operating at a second voltage higher than the first voltage, comprising:
a first inverter coupled between the second voltage and the first voltage;
a second inverter coupled between the second voltage and the first voltage, the second inverter being cross-coupled with the first inverter for latching a value therein;
a first switch module comprising a PMOS transistor having a source coupled to the first inverter and a gate coupled to the first voltage via a first resistor to reduce a voltage difference between the gate and the source of the PMOS transistor, and an NMOS transistor having a source coupled to an input signal and a drain coupled to the PMOS transistor; and
a second switch module coupled between a data storage node of the first and second inverters and an inverted input signal swinging between the ground voltage and the first voltage,
wherein the first and second inverters and the first and second switch modules include one or more MOS transistors with gate oxide layers of the same thickness.

2. The level shifter of claim 1 wherein the first inverter comprises a first PMOS transistor having its source coupled to the second voltage, and a first NMOS transistor having its drain coupled to a drain of the first PMOS transistor, the first PMOS and NMOS transistors having gates connected together.

3. The level shifter of claim 2 wherein the second inverter comprises a second PMOS transistor having its source coupled to the second voltage, and a second NMOS transistor having its drain coupled to a drain of the second PMOS transistor, the second PMOS and NMOS transistors having gates connected together.

4. The level shifter of claim 3 wherein the gates of the first PMOS and NMOS transistors are coupled to the drains of the second PMOS and NMOS transistors, and the gates of the second PMOS and NMOS transistors are coupled to the drains of the first PMOS and NMOS transistors.

5. The level shifter of claim 1 wherein the second switch module comprises a third PMOS transistor having a source coupled to the drains of the second PMOS and NMOS transistors, and a third NMOS transistor having a drain coupled to a drain of the third PMOS transistor and a source coupled to the inverted input signal.

6. The level shifter of claim 5 further comprising an inverter coupled between the sources of the NMOS transistor and third NMOS transistor.

7. The level shifter of claim 5 wherein the gate of the third PMOS transistor is coupled to the first voltage via the first resistor.

8. The level shifter of claim 6 wherein the gates of the NMOS transistor and third NMOS transistor are coupled to the first voltage via a second resistor.

9. The level shifter of claim 1 wherein the gate oxide layer has a thickness no greater than 40 angstroms.

10. A level shifter for interfacing a first circuit operating at a first voltage higher than a ground voltage with a second circuit operating at a second voltage higher than the first voltage, comprising:
    a first PMOS transistor having its source coupled to the second voltage;
    a first NMOS transistor coupled between the first PMOS transistor and the first voltage, the first PMOS and NMOS transistors having gates connected together;
    a second PMOS transistor having its source coupled to the second voltage;
    a second NMOS transistor coupled between the second PMOS transistor and the first voltage, the second PMOS and NMOS transistors having gates connected to the drains of the first PMOS and NMOS transistors, the first PMOS and NMOS transistors having gates connected to the drains of the second PMOS and NMOS transistors;
    a first switch module comprising a third PMOS transistor having a source coupled to a drain of the first PMOS transistor, a gate coupled to the first voltage via a first resistor to reduce a voltage difference between the gate and the source of the third PMOS transistor and a third NMOS transistor having a source coupled to an input signal and a drain coupled to the third PMOS transistor; and
    a second switch module coupled between the drain of second PMOS transistor and an inverted input signal swinging between the ground voltage and the first voltage.

11. The level shifter of claim 10 wherein the second switch module comprises a fourth PMOS transistor having a source coupled to the drains of the second PMOS and NMOS transistors, and a fourth NMOS transistor having a drain coupled to a drain of the fourth PMOS transistor and a source coupled to the inverted input signal.

12. The level shifter of claim 11 further comprising an inverter coupled between the sources of the third and fourth NMOS transistors.

13. The level shifter of claim 12 wherein the gate of the fourth PMOS transistor is coupled to the first voltage via the first resistor.

14. The level shifter of claim 10 wherein the gates of the third and fourth NMOS transistors are coupled to the first voltage via a second resistor.

15. A level shifter for interfacing a first circuit operating at a first voltage higher than a ground voltage with a second circuit operating at a second voltage higher than the first voltage, comprising:
    a first PMOS transistor having its source coupled to the second voltage;
    a first NMOS transistor coupled between the first PMOS transistor and the first voltage, the first PMOS and NMOS transistors having gates connected together;
    a second PMOS transistor having its source coupled to the second voltage;
    a second NMOS transistor coupled between the second PMOS transistor and the first voltage, the second PMOS and NMOS transistors having gates connected to the drains of the first PMOS and NMOS transistors, the first PMOS and NMOS transistors having gates connected to the drains of the second PMOS and NMOS transistors;
    a third PMOS transistor having a source coupled to the drains of the first PMOS and NMOS transistors, and a gate coupled to the first voltage via a first resistor to reduce a voltage difference between the gate and the source of the third PMOS transistor;
    a third NMOS transistor having a drain coupled to a drain of the third PMOS transistor and a source coupled to an input signal;
    a fourth PMOS transistor having a source coupled to the drains of the second PMOS and NMOS transistors; and
    a fourth NMOS transistor having a drain coupled to a drain of the fourth PMOS transistor and a source coupled to an inverted input signal,
    wherein the first, second, third and fourth PMOS and NMOS transistors have gate oxide layers of the same thickness.

16. The level shifter of claim 15 further comprising an inverter coupled between the sources of the third and fourth NMOS transistors.

17. The level shifter of claim 15 wherein the gate of the fourth PMOS transistor is coupled to the first voltage via the first resistor.

18. The level shifter of claim 15 wherein the gates of the third and fourth NMOS transistors are coupled to the first voltage via a second resistor.

* * * * *